US009807903B2

(12) United States Patent
Kuan et al.

(10) Patent No.: US 9,807,903 B2
(45) Date of Patent: Oct. 31, 2017

(54) KEY LOCK MODULE FOR MOUNTING AND SECURING AN INFORMATION HANDLING SYSTEM

(71) Applicant: Dell Products L.P., Round Rock, TX (US)

(72) Inventors: Yi-Hsin Kuan, Taipei (TW); Yao-Chien Lien, Taipei (TW); Yen Tai Liu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 55 days.

(21) Appl. No.: 15/061,706

(22) Filed: Mar. 4, 2016

(65) Prior Publication Data

US 2017/0257969 A1    Sep. 7, 2017

(51) Int. Cl.
*E05B 65/00*   (2006.01)
*H05K 7/14*    (2006.01)
*E05B 65/44*   (2006.01)

(52) U.S. Cl.
CPC .......... *H05K 7/1489* (2013.01); *E05B 65/44* (2013.01)

(58) Field of Classification Search
CPC .... H05K 7/1489; H05K 7/1488; E05B 65/44; E05B 65/46; Y10T 292/0905
USPC .............. 70/58, 62, 78–87; 292/87–89, 210; 211/26; 361/679.57, 679.58; 312/334.4
See application file for complete search history.

(56) References Cited

U.S. PATENT DOCUMENTS

| 2,399,812 | A  | * | 5/1946 | Ledin ...................... E05B 65/44 292/DIG. 37 |
| 7,617,706 | B1 | * | 11/2009 | Kuo ........................ E05B 65/46 292/182 |
| 2002/0056296 | A1 | * | 5/2002 | Weinerman ........... E05B 13/105 70/79 |
| 2005/0056063 | A1 | * | 3/2005 | Zadak ................... A47F 5/0861 70/57.1 |
| 2006/0092605 | A1 | * | 5/2006 | DeLuga ................ G06F 1/1632 361/679.58 |
| 2016/0128221 | A1 | * | 5/2016 | Butterbaugh ........ H05K 7/1492 211/26 |

* cited by examiner

*Primary Examiner* — Lloyd Gall
(74) *Attorney, Agent, or Firm* — Baker Botts L.L.P.

(57) ABSTRACT

A key lock module for securing a chassis for use with an information handling system to a rack. The key lock module includes a bracket and a rotatable lock housed in the bracket. The rotatable lock includes a locking arm configured to rotate between a locked position and an unlocked position. The key lock module also includes a bracket hook having a first end and a second end. The first end is coupled to the bracket such that the bracket hook may be depressed when the rotatable lock is in the unlocked position. The second end is positioned to interface with the locking arm when the rotatable lock is in the locked position such that the bracket hook may not be depressed. The bracket hook also is configured to engage with a rack to prevent a chassis associated with the key lock module from being removed from the rack when the bracket hook is not depressed.

20 Claims, 7 Drawing Sheets

KEY LOCK MODULE FOR MOUNTING AND SECURING AN INFORMATION HANDLING SYSTEM

BACKGROUND

Field of the Disclosure

This disclosure relates generally to information handling systems and more particularly to a key lock module for use with an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

In various information handling systems, a key lock is used to secure and prevent unauthorized access or removal of one or more of the information handling system components from a chassis, which is typically mounted on a rack.

SUMMARY

One aspect of the present disclosure is a key lock module configured to secure a chassis for use with an information handling system in a rack. The key lock module may include a bracket and a rotatable lock housed in the bracket. The rotatable lock may include a locking arm configured to rotate between a locked position and an unlocked position. The key lock module also may include a bracket hook having a first end and a second end. The first end may be coupled to the bracket such that the bracket hook may be depressed when the rotatable lock is in the unlocked position. The second end may be positioned to interface with the locking arm when the rotatable lock is in the locked position such that the bracket hook may not be depressed. The bracket hook also may be configured to engage with a rack to prevent a chassis associated with the key lock module from being removed from the rack when the bracket hook is not depressed.

Another disclosed aspect includes a rack system for use with an information handling system. The rack system may include a vertical post configured to interface with a key lock module. The key lock module may include a bracket and a rotatable lock housed in the bracket. The rotatable lock may include a locking arm configured to rotate between a locked position and an unlocked position. The key lock module also may include a bracket hook having a first end and a second end. The first end may be coupled to the bracket such that the bracket hook may be depressed when the rotatable lock is in the unlocked position. The second end may be positioned to interface with the locking arm when the rotatable lock is in the locked position such that the bracket hook may not be depressed. The bracket hook also may be configured to engage with a rack to prevent a chassis associated with the key lock module from being removed from the rack when the bracket hook is not depressed.

Another disclosed aspect includes an information handling system comprising a chassis configured to house the information handling system and a rack with a vertical post configured to interface with a key lock module. The key lock module may include a bracket and a rotatable lock housed in the bracket. The rotatable lock may include a locking arm configured to rotate between a locked position and an unlocked position. The key lock module also may include a bracket hook having a first end and a second end. The first end may be coupled to the bracket such that the bracket hook may be depressed when the rotatable lock is in the unlocked position. The second end may be positioned to interface with the locking arm when the rotatable lock is in the locked position such that the bracket hook may not be depressed. The bracket hook also may be configured to engage with a rack to prevent the chassis associated with the key lock module from being removed from the rack when the bracket hook is not depressed.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
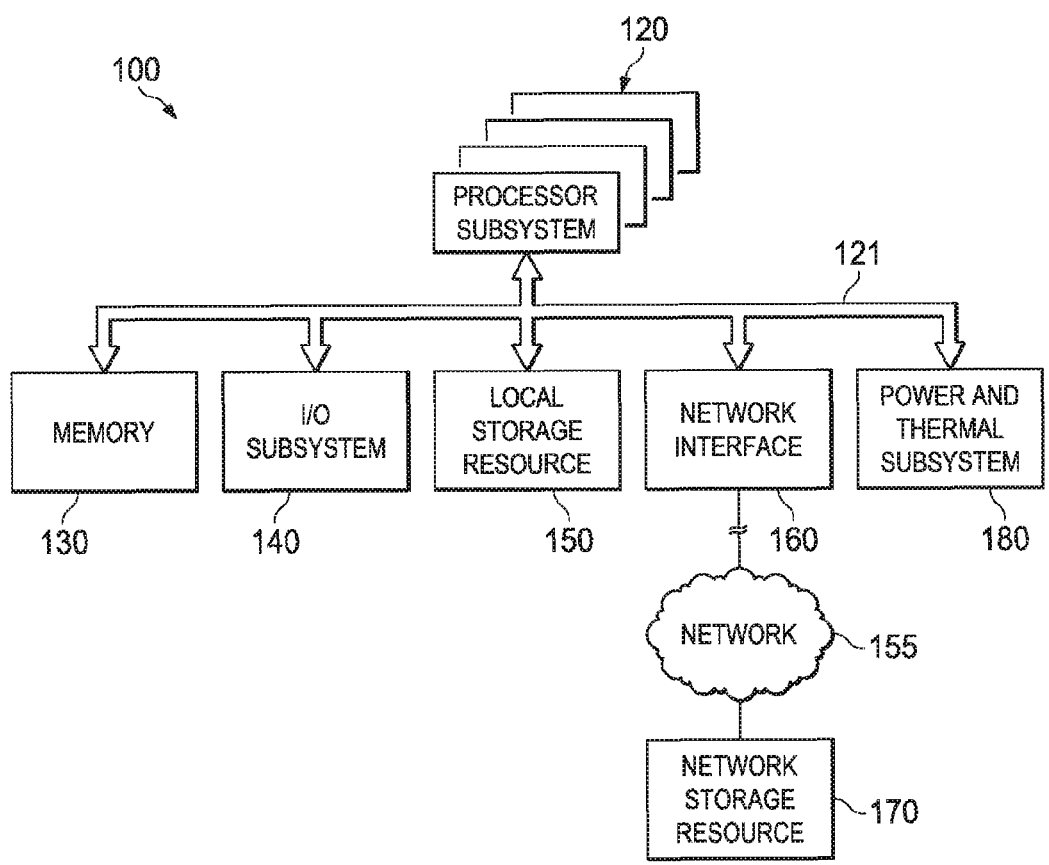
FIG. 1 is a block diagram of selected functional elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), widget "12-1" refers to an instance of a widget class, which may be referred to collectively as widgets "12" and any one of which may be referred to generically as a widget "12". In the figures and the description, like numerals are intended to represent like elements.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments are best understood by reference to FIGS. 1-5 wherein like numbers are used to indicate like and corresponding parts.

FIG. 1 illustrates a block diagram of selected functional elements of an embodiment of an information handling system 100. As discussed above, information handling system 100 may be used to process and store information for various purposes. As will be described in more detail below, information handling system 100 and/or components of information handling system 100 may be housed in a chassis. Information handling system 100 and/or components of information handling system 100 may be secured in a chassis mounted on a rack by a key lock module, which may prevent the unauthorized removal of the chassis and information handling system 100 and/or components of information handling system 100. Additionally, in FIG. 1, external or remote elements such as network 155 and network storage resource 170 are also shown to give context to an environment in which information handling system 100 may be configured to operate.

As shown in FIG. 1, components of information handling system 100 may include, but are not limited to, processor subsystem 120, which may comprise one or more processors, and system bus 121 that communicatively couples various system components to processor subsystem 120 including, for example, memory subsystem 130, I/O subsystem 140, local storage resource 150, network interface 160, and power and thermal subsystem 180. System bus 121 may represent a variety of suitable types of bus structures, such as a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI Express (PCIe) bus, HyperTransport (HT) bus, and Video Electronics Standards Association (VESA) local bus.

In FIG. 1, network interface 160 may include a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a network attached storage (NAS), a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof. In certain embodiments, information handling system 100 and network 155 may be included in a rack domain.

As depicted in FIG. 1, processor subsystem 120 may comprise a system, device, or apparatus operable to interpret and/or execute program instructions and/or process data, and may include one or more microprocessors, microcontrollers, digital signal processors (DSPs), application specific integrated circuits (ASICs), or other digital or analog circuitry configured to interpret and/or execute program instructions and/or process data. In some embodiments, processor subsystem 120 may interpret and/or execute program instructions and/or process data stored locally (e.g., in memory subsystem 130). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as information handling system 100, is powered down.

In FIG. 1, local storage resource 150 may comprise computer-readable media (e.g., hard disk drive, solid state drive, floppy disk drive, CD-ROM, and/or other types of rotating storage media, flash memory, EEPROM, and/or other types of solid state storage media) and may be generally operable to store instructions and/or data. For example, local storage resource 150 may store executable code in the form of program files that may be loaded into memory subsystem 130 for execution. In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces.

As shown, information handling system 100 may also include a power and thermal subsystem 180. Power and thermal subsystem 180 may be implemented in any suitable manner. For example, power and thermal subsystem 180 may include one or more components such as power supplies, power controllers, fans, fan controllers, heat sinks, air baffles, etc., configured to provide power to components within information handling system 100 and to ensure that thermal design constraints for the components are met (e.g., by cooling the components). Accordingly, certain components included within information handling system 100 (e.g., components within processor subsystem 120, memory 130, etc.) may operate by consuming power provided by power and thermal subsystem 180. In certain examples, designers of information handling system 100 may budget and account for power expected to be consumed by one or more of the components and may design power and thermal subsystem 180 to include an appropriate power supply configured to power the components.

Additionally, power and thermal subsystem 180 may be configured to cool components within information handling system 100 to ensure that the components satisfy various thermal design constraints. For example, thermal design constraints may be satisfied when an airflow passes over a component or through a heat sink associated with the component in order to properly cool the component. As such, power and thermal subsystem 180 may include one or more fans to generate the airflow.

Figure 2:
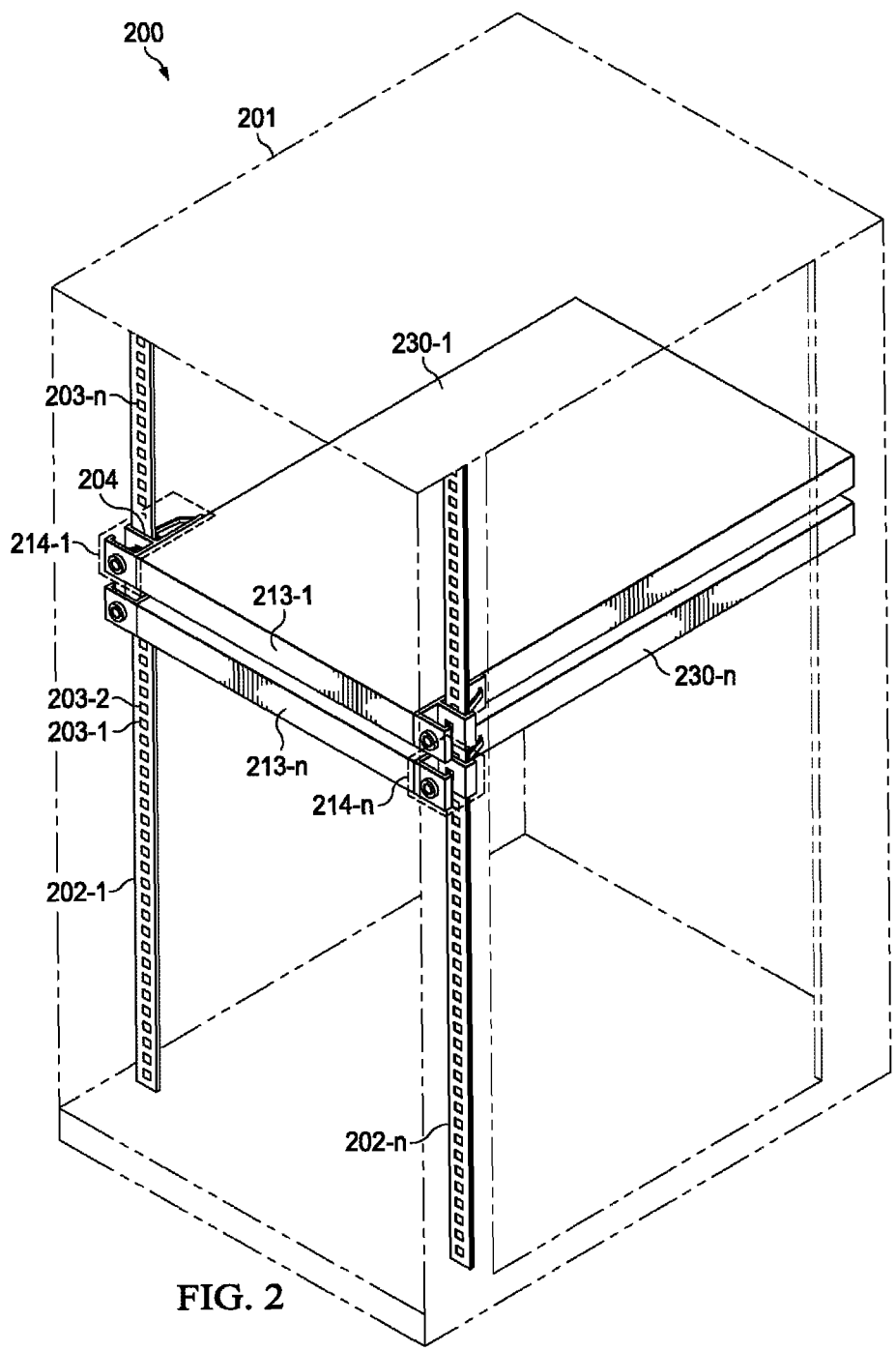
FIG. 2 is an isometric view of selected hardware elements of a rack system used to house components of an information handling system.

FIG. 2 is an isometric view of selected elements of an embodiment of rack system 200 including chassis 230 (e.g., chassis 230-1 through 230-n). Chassis 230 may be any kind that may suit a particular embodiment. Chassis 230 may be made out of any hard, sturdy material such as metal or a hard plastic. Additionally, chassis 230 may be may be made out of a solid sheet of material or may include a cage or lattice structure, which may allow for airflow but may restrict removal of any information handling system components. Chassis 230 may slide into the interior body of rack enclosure 201. Rack enclosure 201 may be any kind that may suit a particular embodiment. Rack enclosure 201 may include any component and/or feature configured to mount and/or secure chassis 230 to prevent the unauthorized removal of chassis 230 from rack enclosure 201. For example, rack enclosure 201 may include vertical posts 202 (e.g., vertical post 202-1 through vertical post 202-n) configured to mount and secure chassis 230 by interfacing vertical posts 202 with key lock modules 214 (e.g., key lock module 214-1 through key lock module 214-n) in opening 204, as will be described in further detail below. Although vertical posts 202 are shown as having slots 203 (e.g., slot 203-1 through slot 203-n), other alternatives are contemplated. For example, vertical posts 202 may have no slots 203. Vertical posts 202 may allow chassis 230 to be vertically stacked, thereby simplifying the storage and/or organization of chassis 230.

Chassis 230 may house an information handling system, such as information handling system 100, as discussed above in reference to FIG. 1. Chassis 230 also may house information handling system components, such as internal components and/or external components. Internal components may include, but are not limited to, a motherboard, microprocessors, circuit boards, and power supplies. External components may include, but are not limited to, data drives, CD-ROM, and disks. An information handling system associated with or enclosed within chassis 230 may be a rack server, meaning that the information handling system may be configured to be mounted in a rack system.

Chassis 230 may include bezels 213 (e.g., bezel 213-1 through bezel 213-n). Similar to chassis 230, bezels 213 may be made out of any hard, sturdy material such as metal or a hard plastic. Bezels 213 also may be may be made out of a solid sheet of material or may include a cage or lattice structure, which may allow for airflow but may restrict removal of any information handling system components. Additionally, bezels 213 may include any component configured to attach and/or secure bezels 213 to the open front of chassis 230 to prevent the unauthorized access or removal of an information handling system and/or information handling system components housed within chassis 230. As will be discussed in more detail below, bezels 213 may be secured to chassis 230 by the same key lock modules 214 that secure chassis 230 to vertical posts 202. Configuring key lock modules 214 both to mount and secure chassis 230 to vertical posts 202 and to secure bezels 213 to chassis 230 may allow for the use of less components in securing an information handling system and/or information handling system components housed within chassis 230 and may result in cheaper assembly costs.

Figure 3A:
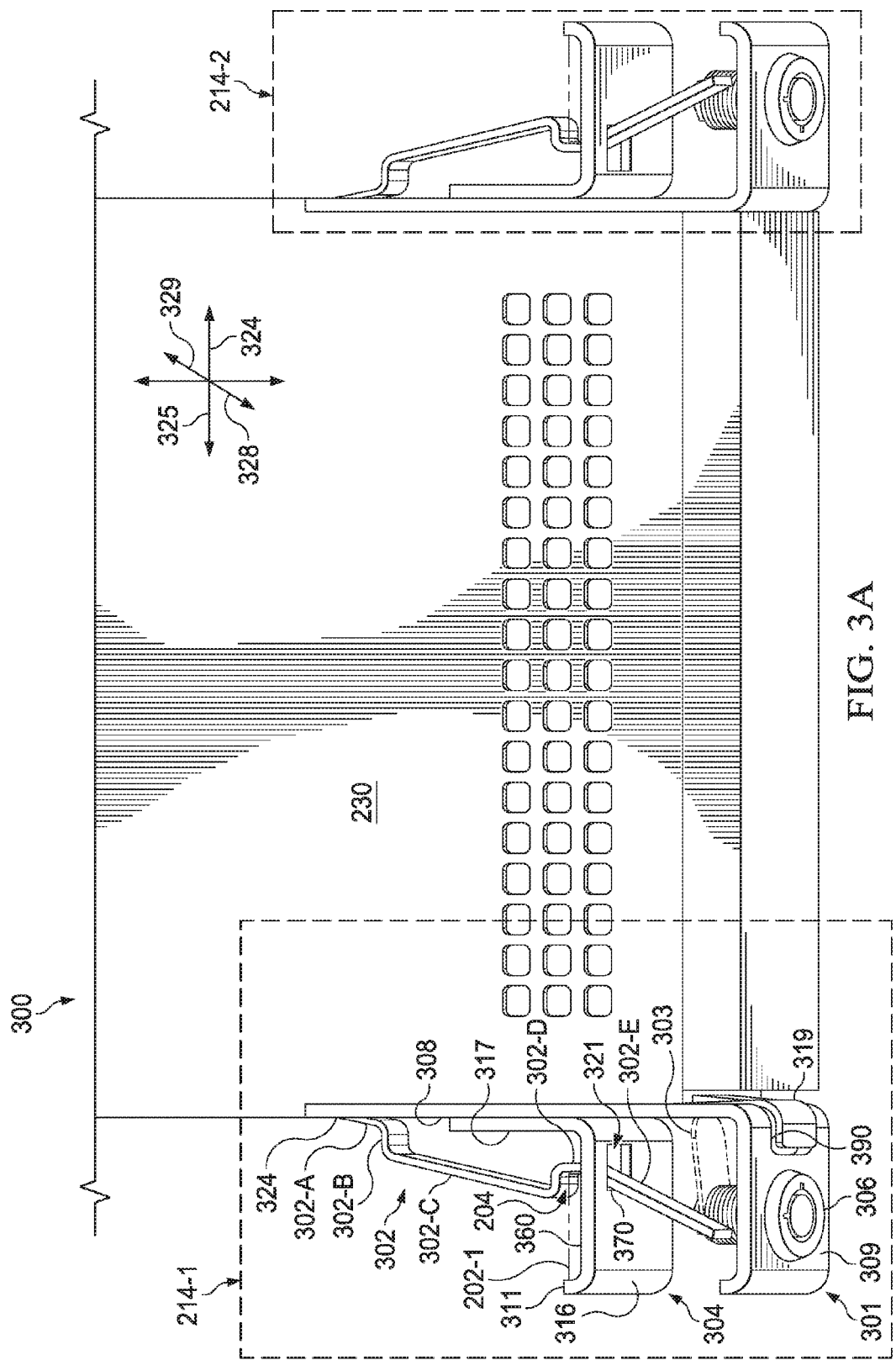
FIGS. 3A, 3B, and 3C are isometric views of selected hardware elements of an embodiment of a key lock module for use with an information handling system.
Figure 3B:
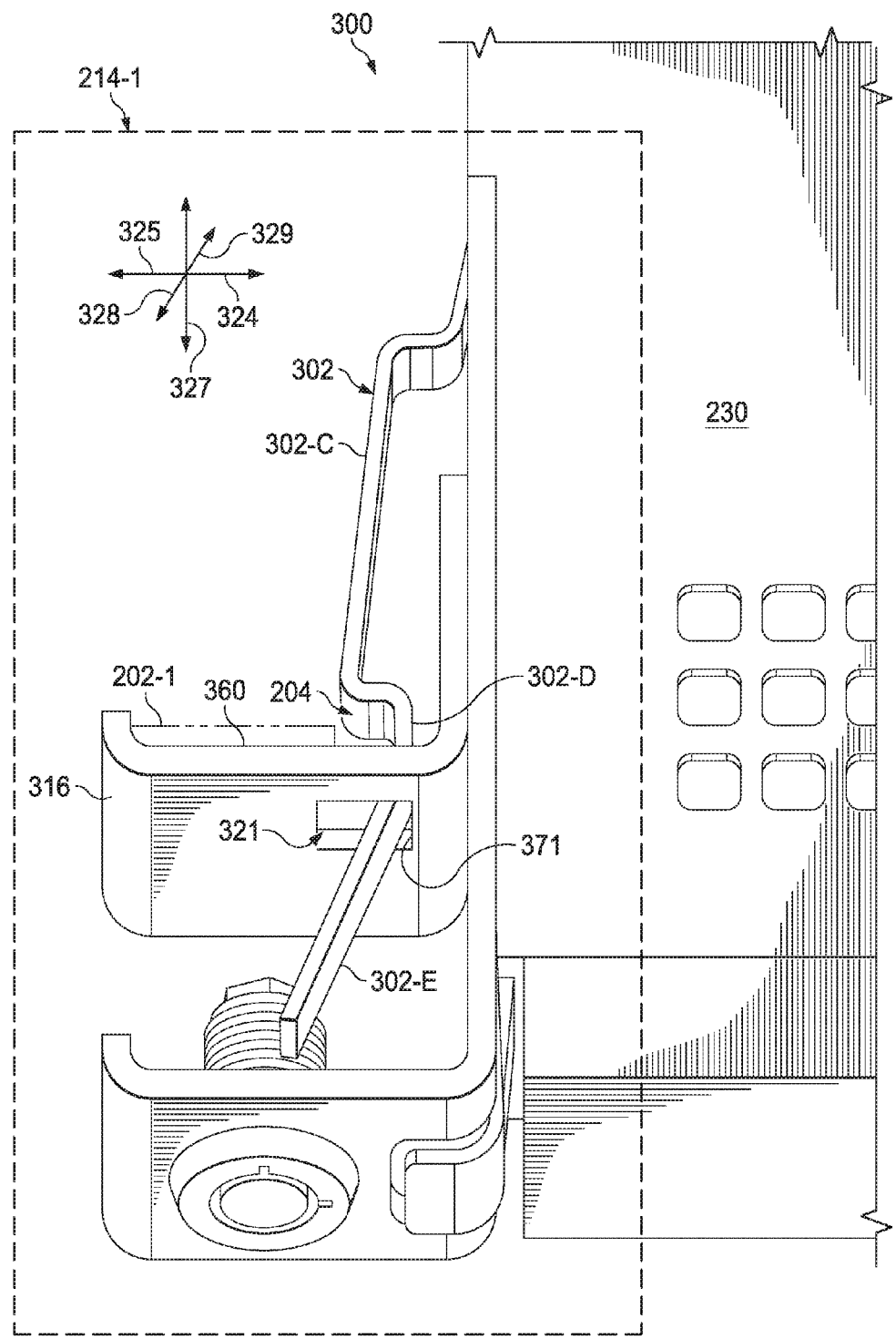
Figure 3C:
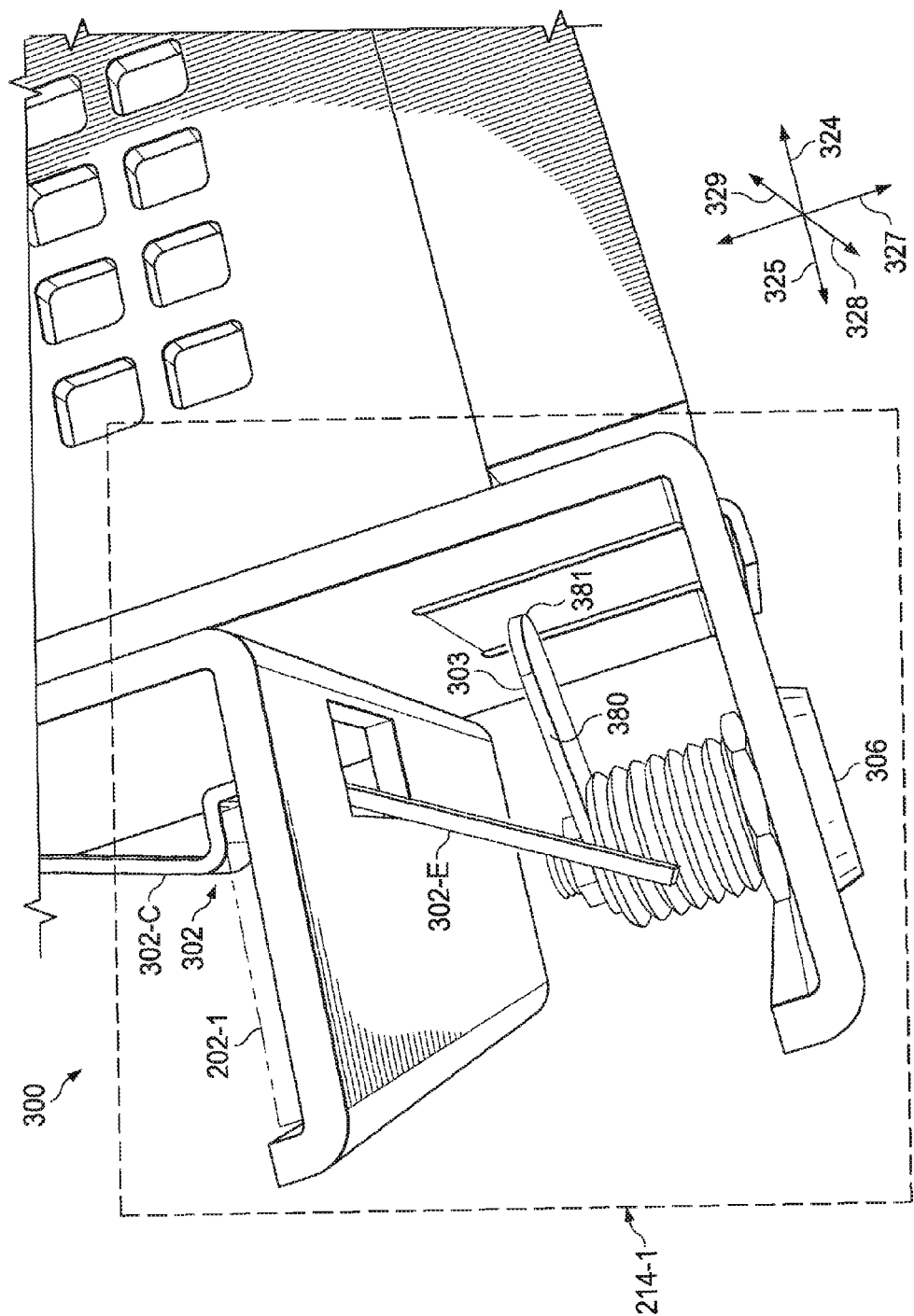

To illustrate, FIGS. 3A, 3B, and 3C show a bottom view of selected elements of an embodiment of chassis 230 including key lock modules 214 (e.g., key lock module 214-1 and key lock module 214-2). Specifically, FIG. 3A shows the embodiment of key lock modules 214 interfacing with vertical posts 202. FIG. 3B shows an embodiment of key lock module 214-1 in a depressed position and not interfacing with vertical post 202-1. FIG. 3C shows the embodiment of key lock module 214-1 interfacing with vertical post 202-1 and in a locked position. Key lock modules 214 may be made out of any hard, sturdy material such as a hard plastic or preferably metal. Although key lock modules 214 may be described below in reference to key lock module 214-1, it will be understood that key lock module 214-2 may be identically or similarly treated as key lock module 214-1 unless otherwise stated. Additionally, key lock modules 214 and other components in FIG. 3 may not be drawn to scale.

As shown in FIG. 3, key lock modules 214 may be configured to be the attachment point between chassis 230 and vertical posts 202. In this instance, key lock modules 214 may be configured to allow chassis 230 to mount to vertical posts 202. Key lock module 214-1 may be configured to attach to the right side of chassis 230, while key lock module 214-2 may be configured to attach to the left side of chassis 230. Additionally, and as will be discussed in further detail in reference to FIG. 4, key lock module 214-1 may include key lock latch 319 and opening 390, but key lock module 214-2 may not include key lock latch 319 or opening 390. Key lock module 214-1 may include front bracket 301 and back bracket 304. Front bracket 301 may include side portion 308 and front portion 309. Side portion 308 may be attached to chassis 230 through any kind of mechanical fastener, such as a screw or a bolt, or through any other suitable mechanism (e.g., welding). Front portion 309 may include a hole in which rotatable lock 306 fits. Rotatable lock 306 may be any kind of lock and may include locking arm 303, which will be discussed in further detail in reference to FIG. 3C.

Back bracket 304 may include side portion 317, which may be attached to side portion 308 of front bracket 301 through any kind of mechanical fastener, such as a screw or a bolt, or through any other suitable mechanism (e.g., welding). Back bracket 304 also may include front portion 316. Front portion 316 may include hole 321, which may be located closer in proximity to side portion 317 than to end portion 311. Hole 321 preferably may be shaped as a square or as a rectangle but may be of any shape such as an oval or a circle. Additionally, hole 321 may be any size so long as bracket hook 302 may be disposed through hole 321 and may easily move in x-direction 324 and x-direction 325.

Bracket hook 302 may be configured to be disposed in hole 321. In the present embodiment, bracket hook 302 may have an angled or a ramped profile with arms 302-A, 302-B, 302-C, 302-D, and 302-E. Arm 302-A may be the first end of bracket hook 302 and arm 302-E may be the second end of bracket hook 302. Although not explicitly shown in FIG. 3, other alternatives are contemplated. For example, bracket hook 302 may have an angled profile with more or less arms. Bracket hook 302 may be attached at its first end by arm 302-A to side portion 308 of front bracket 301 though any suitable mechanism, such as welding. Bracket hook 302 may be spring-like around attachment point 324, which may join arm 302-A to side portion 308. For example, when a user moves arm 302-E of the second end of bracket hook 302 in x-direction 324, bracket hook 302 may be depressed and move in x-direction 324. However, when a user releases arm 302-E, bracket hook 302 may spring back in x-direction 325 to its resting position.

To illustrate, FIG. 3A shows bracket hook 302 of key lock module 214-1 in a resting position and interfacing with vertical post 202-1. Specifically, when bracket hook 302 is in a resting position, vertical post 202-1 may interface with the end of arm 302-C closest in proximity to arm 302-D, arm 302-D, the end of arm 302-E closest in proximity to arm 302-D, and back side 360 of front portion 304. Opening 204 where vertical post 202-1 may be positioned, as discussed above in reference to FIG. 2, may be created by arm 302-C, arm 302-D, arm 302-E, and backside 360 of front portion 316. Additionally, in the resting position, arm 302-E may be interfacing with side 370 of hole 321. In this resting position, vertical post 202-1 may be interfacing with bracket hook 302 in opening 204 such that chassis 230 may not move in z-direction 328. If chassis 230 cannot move in z-direction 328, then chassis 230 may not be removed from a rack enclosure (not shown), such as rack enclosure 201 discussed above in reference to FIG. 2.

FIG. 3B shows bracket hook 302 of key lock module 214-1 in a depressed position and not interfacing with vertical post 202-1 through opening 204. Bracket hook 302 may be depressed when locking arm 303 is in an unlocked position, as will be discussed in further detail in reference to FIG. 3C and FIG. 5, by a user moving the end of arm 302-E most distal to arm 302-D in x-direction 324, such that arm 302-E is interfacing with side 371 of hole 321. In a depressed position, vertical post 202-1 may not be positioned in opening 204 and thus may not be interfacing with arm 302-C, arm 302-D, and arm 302-E. Additionally, when bracket hook 302 is in a depressed position, chassis 230 may be removed from a rack enclosure (not shown), such as rack enclosure 201 discussed above in reference to FIG. 2, by a user pulling in z-direction 328 so that backside 360 of front portion 316 may not interface with vertical post 202-1. Although not explicitly shown in FIG. 3B, it will be understood that key lock module 214-1 and key lock module 214-2 may both be in the depressed position for chassis 230 to be removed from a rack enclosure.

FIG. 3C shows bracket hook 302 of key lock module 214-1 in a resting position and interfacing with vertical post 202-1 with rotatable lock 306 in a locked position. As shown in FIG. 3C, rotatable lock 306 may include locking arm 303. Rotatable lock 306 may be movable between a locked position, as shown in FIG. 3C, and an unlocked position by using a key (not shown) to turn rotatable lock 306 in the clockwise direction. When rotatable lock 306 is in an unlocked position, end 381 of locking arm 303 points in y-direction 327, as will be shown in FIG. 5. When rotatable lock 306 is in a locked position, locking arm 303 may be positioned at an angle such that sloped edge 380 of locking arm 303 may interface with arm 302-E of bracket hook 302. Accordingly, when edge 380 of locking arm 303 interfaces with arm 302-E, bracket hook 302 may not be depressed by moving arm 302-E in x-direction 324. Thus, when bracket hook 302 is in a resting position and rotatable lock 306 is in a locked position, chassis 230 may be securely housed within a rack enclosure (not shown), such as rack enclosure 201 discussed above in reference to FIG. 2. Thus, chassis 230 may not be removed from rack enclosure 201.

To the contrary, when rotatable lock 306 is in an unlocked position, as shown in FIG. 3B and as will be shown in further detail in reference to FIG. 5, ridge 380 of locking arm 303 may not interface with arm 302-E, thereby allowing bracket hook 302 to be depressed and chassis 230 to be removed from a rack enclosure, such as rack enclosure 201, as described above in reference to FIG. 3B. Similarly, chassis 230 may be inserted into a rack enclosure, such as rack enclosure 201, such that that key lock module 214-1 may interface with vertical post 202-1, by sliding chassis 230 in z-direction 329. During insertion of chassis 230, vertical post 202-1 may press against 302-C, depressing bracket hook 302 in x-direction 324 until bracket hook 302 springs back into its resting position, as described above in reference to FIG. 3A.

Figure 4:
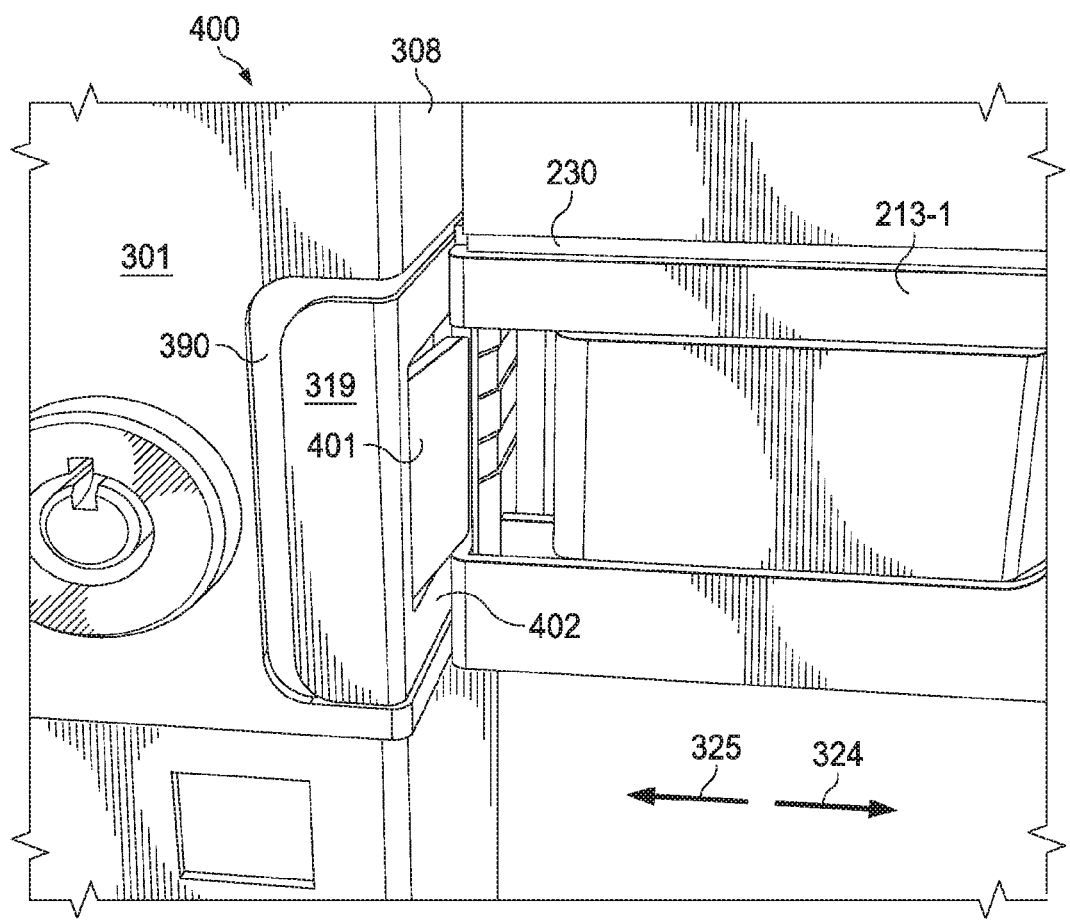
FIG. 4 is an enlarged front view of selected elements of an embodiment of a key lock module for use with an information handling system.

FIG. 4 shows an enlarged front view of selected elements of an embodiment of key lock module 214-1, as discussed above in reference to FIG. 3. In addition to key lock module 214-1 being configured to mount and secure chassis 230 to vertical post 202-1 to prevent the unauthorized removal of chassis 230 from a rack enclosure, such as rack enclosure 201 (not shown), key lock module 214-1 also may be configured to secure bezel 213-1 to chassis 230, thereby preventing the unauthorized access or removal of an information handling system and/or information handling system components housed within chassis 230. Accordingly, key lock module 214-1 may include key lock latch 319. Key lock latch 319 may be configured to retain bezel 213-1 in place with respect to chassis 230 by hook 401. Key lock latch 319 may be configured to extend from or be attached by any suitable mechanism, such as welding, to side portion 308 of front bracket 301, such that key lock latch 319 may be spring-like. Accordingly, key lock latch 319 may be moved to a release position in x-direction 325 and into opening 390 and may spring back in x-direction 324 to its original position once a user releases contact with side 402 of key lock latch 319.

When rotatable lock 306 is in an unlocked position, as discussed above in reference to FIG. 3 and as will be further shown in FIG. 5, key lock latch 319 may be moved to a release position in x-direction 325 to release hook 401 from bezel 213-1, thereby allowing bezel 213-1 to be removed from chassis 230. When bezel 213-1 is being attached to chassis 230, pressing bezel 213-1 against chassis 230 such that it brushes side 402 of key lock latch 319 may engage hook 401, thereby retaining bezel 213-1 in place with respect to chassis 230. As explained above in reference to FIG. 3, key lock module 214-1 may include key lock latch 319 and opening 390 and thus may be configured to secure bezel 213-1 to chassis 230. However, key lock module 214-2 may not have key lock latch 319 or opening 390 and thus may not be configured to secure bezel 213-1 to chassis 230.

Figure 5A:
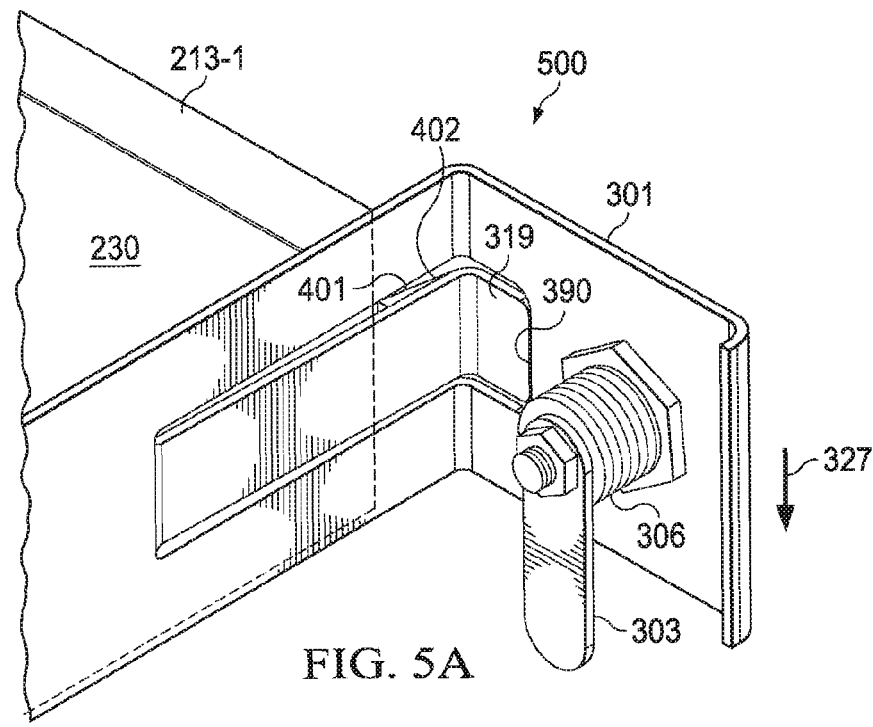
FIGS. 5A and 5B are back views of selected elements of an embodiment of a key lock module for use with an information handling system.
Figure 5B:
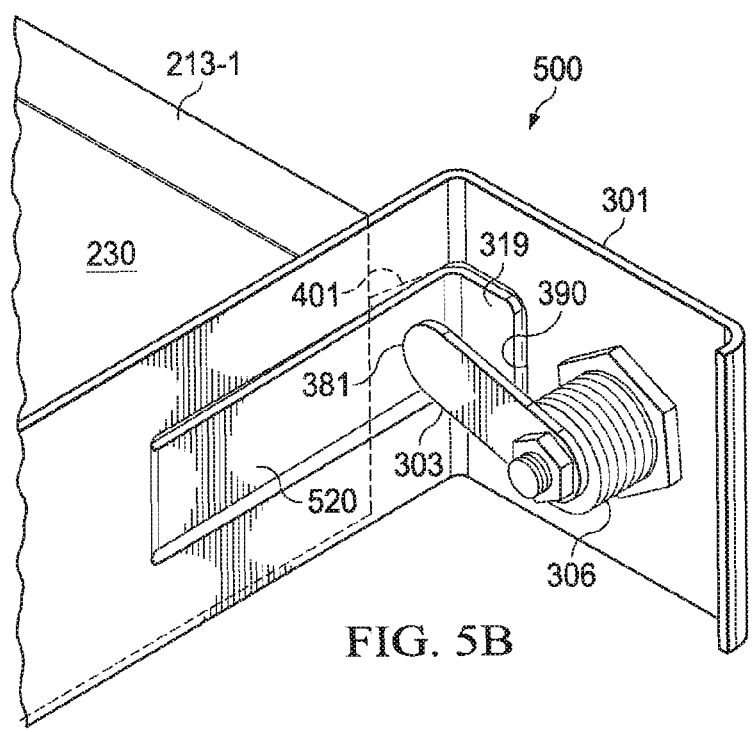

FIGS. 5A and 5B show a back view of selected elements of an embodiment of key lock module 214-1, as discussed above in reference to FIGS. 3 and 4, with rotatable lock 306. Key lock module 214-1 may not be drawn to scale and may include additional or fewer components than those components shown in FIGS. 5A and 5B. More specifically, FIG. 5A is a back view of selected elements of an embodiment of key lock module 214-1 with rotatable lock 306 in an unlocked position. Rotatable lock 306 may be in an unlocked position when locking arm 303 may be pointing in y-direction 327, as discussed above in reference to FIG. 3C. When rotatable lock 306 is in an unlocked position, key lock latch 319 may be pushed at side 402 into opening 390, thereby releasing hook 401 from bezel 213-1.

FIG. 5B is a back view of selected elements of an embodiment of key lock module 214-1 in a locked position. When rotatable lock 306 is in a locked position, locking arm 303 may be positioned at an angle such that sloped edge 380 of locking arm 303 may not only interface with bracket hook 302, as discussed above in reference to FIG. 3, but also such that end 381 of locking arm 303 may interface with interior side 520 of key lock latch 319. Accordingly, key lock latch 319 may not be moved into opening 390 to release hook 401 from bezel 213-1. Accordingly, bezel 213-1 may not be disengaged from chassis 230 to allow for the unauthorized access or removal of information handling system components.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A key lock module configured to secure a chassis for use with an information handling system in a rack, the key lock module including:
   a bracket;
   a rotatable lock housed in the bracket and comprising a locking arm configured to rotate between a locked position and an unlocked position; and
   a bracket hook having a first end and a second end, wherein:
      the first end is coupled to the bracket such that the bracket hook may be depressed when the rotatable lock is in the unlocked position;
      the second end is positioned to interface with the locking arm when the rotatable lock is in the locked position such that the bracket hook may not be depressed; and
      the bracket hook is configured to engage with a rack to prevent a chassis associated with the key lock module from being removed from the rack when the bracket hook is not depressed.

2. The key lock module of claim 1, wherein when the rotatable lock is in the unlocked position, the second end of the bracket hook does not interface with the locking arm when the bracket hook is depressed.

3. The key lock module of claim 1, further including a key lock latch and a hook extending from the key lock latch, wherein the key lock latch is configured to interface with the locking arm when the rotatable lock is in the locked position.

4. The key lock module of claim 3, wherein the key lock latch is configured to move to a release position when the rotatable lock is in the unlocked position.

5. The key lock module of claim 1, wherein the bracket includes a front portion and a side portion, the side portion configured to attach to the chassis.

6. A rack system for use with an information handling system comprising:
   a vertical post configured to interface with a key lock module, the key lock module including:
   a bracket;
   a rotatable lock housed in the bracket and comprising a locking arm configured to rotate between a locked position and an unlocked position; and
   a bracket hook having a first end and a second end, wherein:
      the first end is coupled to the bracket such that the bracket hook may be depressed when the rotatable lock is in the unlocked position;
      the second end is positioned to interface with the locking arm when the rotatable lock is in the locked position such that the bracket hook may not be depressed; and
      the bracket hook is configured to engage with a rack to prevent a chassis associated with the key lock module from being removed from the rack when the bracket hook is not depressed.

7. The rack system of claim 6, wherein when the rotatable lock is in the unlocked position, the second end of the bracket hook does not interface with the locking arm when the bracket hook is depressed.

8. The rack system of claim 6, wherein the bracket hook is configured to be depressed to interface with the vertical post during installation of the chassis and removal of the chassis.

9. The rack system of claim 6, wherein the key lock module may not disengage from the vertical post when the rotatable lock is in the locked position.

10. The rack system of claim 6, further including a key lock latch and a hook extending from the key lock latch, wherein the hook is configured to engage with a bezel associated with the chassis.

11. The rack system of claim 10, wherein the key lock latch is configured to interface with the locking arm when the rotatable lock is in the locked position.

12. The rack system of claim 10, wherein the key lock latch is configured to move to a release position when the rotatable lock is in the unlocked position.

13. The rack system of claim 6, further including a second key lock module.

14. An information handling system comprising:
   a chassis configured to house the information handling system; and
   a rack with a vertical post configured to interface with a key lock module, the key lock module including,
   a bracket;
   a rotatable lock housed in the bracket and comprising a locking arm configured to rotate between a locked position and an unlocked position; and
   a bracket hook having a first end and a second end, wherein:
      the first end is coupled to the bracket such that the bracket hook may be depressed when the rotatable lock is in the unlocked position;

the second end is positioned to interface with the locking arm when the rotatable lock is in the locked position such that the bracket hook may not be depressed; and the bracket hook is configured to engage with a rack to prevent the chassis associated with the key lock module from being removed from the rack when the bracket hook is not depressed.

15. The information handling system of claim 14, wherein when the rotatable lock is in the unlocked position, the second end of the bracket hook does not interface with the locking arm when the bracket hook is depressed.

16. The information handling system of claim 14, wherein the bracket hook is configured to be depressed to interface with the vertical post during installation and removal of the chassis.

17. The information handling system of claim 14, wherein the key lock module may not disengage from the vertical post when the rotatable lock is in the locked position.

18. The information handling system of claim 14, further including a key lock latch and a hook extending from the key lock latch, wherein the key lock latch is configured to interface with the locking arm when the rotatable lock is in the locked position.

19. The information handling system of claim 18, wherein the hook is configured to engage with a bezel associated with the chassis.

20. The information handling system of claim 14, further including a second key lock module.

* * * * *